(12) United States Patent
We et al.

(10) Patent No.: US 9,628,052 B2
(45) Date of Patent: Apr. 18, 2017

(54) EMBEDDED MULTI-TERMINAL CAPACITOR

(71) Applicant: QUALCOMM Incorporated, San Diego, CA (US)

(72) Inventors: Hong Bok We, San Diego, CA (US); Dong Wook Kim, San Diego, CA (US); Kyu-Pyung Hwang, San Diego, CA (US); Young Kyu Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 200 days.

(21) Appl. No.: 14/249,189

(22) Filed: Apr. 9, 2014

(65) Prior Publication Data

US 2015/0236681 A1    Aug. 20, 2015

Related U.S. Application Data

(60) Provisional application No. 61/941,275, filed on Feb. 18, 2014.

(51) Int. Cl.
| | |
|---|---|
| *H01L 23/50* | (2006.01) |
| *H03K 3/013* | (2006.01) |
| *H05K 1/18* | (2006.01) |
| *H05K 1/03* | (2006.01) |
| *H05K 3/46* | (2006.01) |
| *G05F 3/08* | (2006.01) |

(Continued)

(52) U.S. Cl.
CPC ............... *H03K 3/013* (2013.01); *G05F 3/08* (2013.01); *H01L 23/49822* (2013.01); *H01L 23/50* (2013.01); *H05K 1/0306* (2013.01); *H05K 1/183* (2013.01); *H05K 1/184* (2013.01); *H05K 3/306* (2013.01); *H05K 3/4697* (2013.01); *H01L 24/13* (2013.01); *H01L 24/16* (2013.01); *H01L 2224/13147* (2013.01); *H01L 2224/16225* (2013.01); *H01L 2924/13091* (2013.01); *H01L 2924/15311* (2013.01); *H05K 2201/10015* (2013.01); *Y10T 29/49139* (2015.01)

(58) Field of Classification Search
None
See application file for complete search history.

(56) References Cited

U.S. PATENT DOCUMENTS

| | | | |
|---|---|---|---|
| 6,611,419 B1 * | 8/2003 | Chakravorty | ..... H01L 23/49822 257/E23.062 |
| 7,230,815 B2 | 6/2007 | Yoon et al. | |

(Continued)

FOREIGN PATENT DOCUMENTS

| | | |
|---|---|---|
| EP | 1137332 A1 | 9/2001 |
| EP | 1691590 A2 | 8/2006 |

OTHER PUBLICATIONS

International Search Report and Written Opinion—PCT/US2015/014885—ISA/EPO—May 7, 2015.

(Continued)

*Primary Examiner* — Charles Garber
*Assistant Examiner* — Alia Sabur
(74) *Attorney, Agent, or Firm* — Loza & Loza, LLP

(57) ABSTRACT

An embedded multi-terminal capacitor embedded in a substrate cavity includes at least one metal layer patterned into a plurality of power rails and a plurality of ground rails. The substrate includes an external power network.

29 Claims, 10 Drawing Sheets

(51) Int. Cl.
    *H05K 3/30*     (2006.01)
    *H01L 23/498*     (2006.01)
    *H01L 23/00*     (2006.01)

(56) References Cited

U.S. PATENT DOCUMENTS

| | | |
|---|---|---|
| 7,875,808 B2 | 1/2011 | Chang et al. |
| 8,098,478 B2 | 1/2012 | Niki et al. |
| 8,184,425 B2 | 5/2012 | Lee et al. |
| 2003/0045083 A1* | 3/2003 | Towle ............... H01L 23/49838 438/612 |
| 2004/0027813 A1* | 2/2004 | Li .................... H01L 23/49822 361/767 |
| 2004/0124004 A1 | 7/2004 | Nair et al. |
| 2006/0193105 A1 | 8/2006 | Sakata et al. |
| 2010/0155886 A1 | 6/2010 | Kim |
| 2011/0180898 A1* | 7/2011 | Tomishima ......... H01L 23/3128 257/532 |
| 2013/0058006 A1 | 3/2013 | Kim |

OTHER PUBLICATIONS

Mezhiba A.V., et al., "Power Distribution Networks in High Speed Integrated Circuits" In: "Power Distribution Networks in High Speed Integrated Circuits", Jan. 1, 2004 (Jan. 1, 2004), Kluwer Academic Publishers, Boston/ Dordrecht / London, XP055277460, ISBN: 978-1-4020-7534-6, pp. 8-13.

* cited by examiner

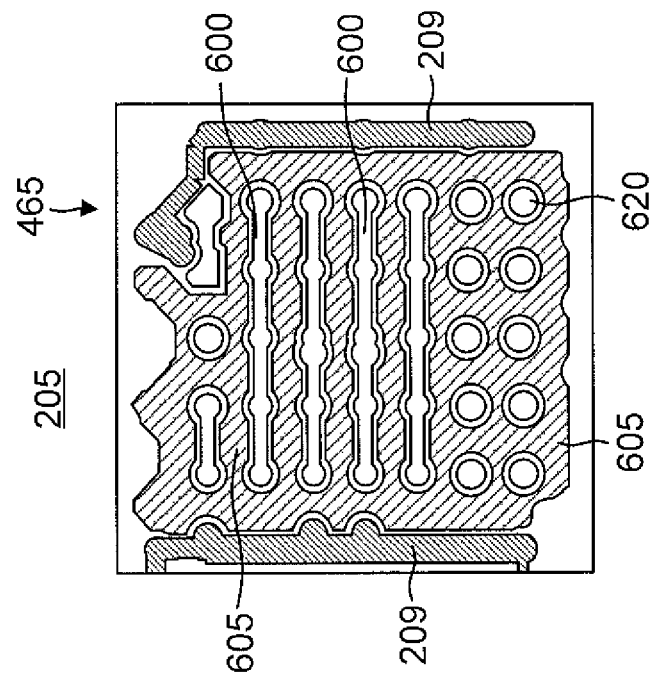
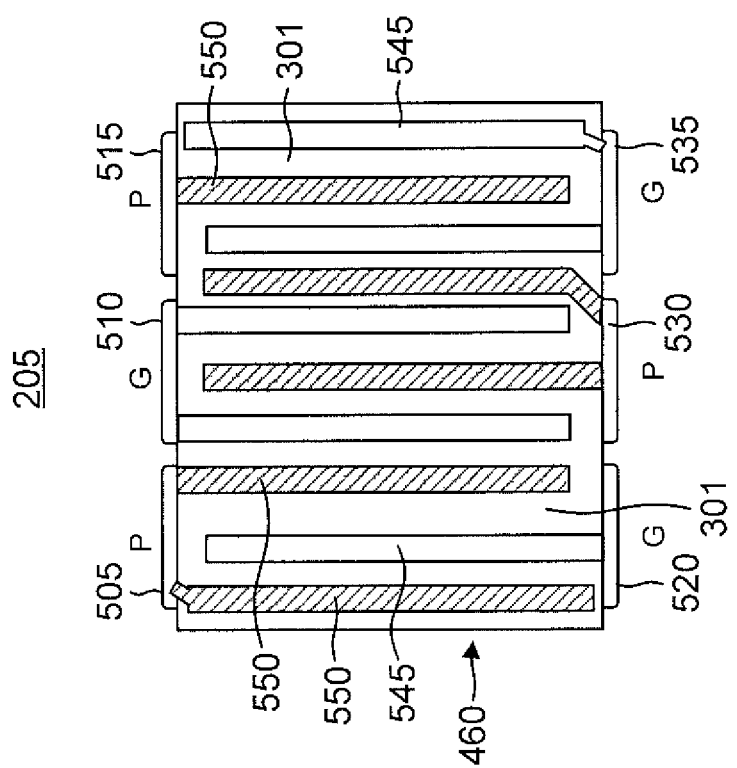
FIG. 6
FIG. 5

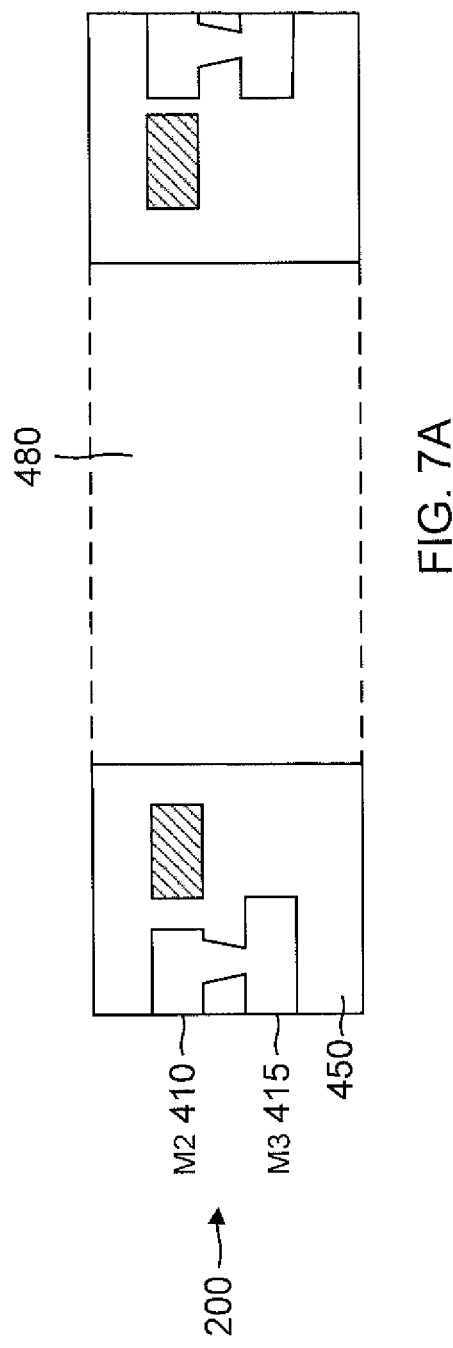

EMBEDDED MULTI-TERMINAL CAPACITOR

CROSS-REFERENCE TO RELATED APPLICATIONS

This application claims the benefit of U.S. Provisional Application No. 61/941,275, filed Feb. 18, 2014, the contents of which are hereby incorporated by reference in their entirety.

TECHNICAL FIELD

This application relates to integrated circuit packaging, and more particularly to a substrate including an embedded multi-terminal capacitor.

BACKGROUND

A digital circuit such as a microprocessor includes numerous transistors that alternate between dormant and switching states. Such digital circuits thus make abrupt current demands when large numbers of transistors switch states. But power supplies cannot react so quickly such that the voltage on the power supply's lead or interconnect to the die including the digital system may dip unacceptably. To smooth the power demands, it is conventional to load the power supply lead to the die with decoupling capacitors. The decoupling capacitors store charge that may be released during times of high power demand so as to stabilize the power supply voltage despite abrupt power demands from the powered digital circuitry.

Decoupling capacitors typically mount to the package substrate or to the circuit board and connect to the die through the power supply interconnects or leads. The interconnect distance between the decoupling capacitor and the die introduces undesirable parasitic inductance and resistance. In addition, the decoupling capacitors demand valuable package substrate or circuit board space. Integrating the decoupling capacitors into the die itself is also undesirable because the decoupling capacitors will then lower density and increase costs. The use of embedded passive capacitors within the package substrate represents another alternative. An example prior art embedded passive capacitor 105 within a substrate 100 is shown in FIG. 1A. An external power supply (not illustrated) provides a power supply voltage VDD1 to a positive terminal P of embedded capacitor 105. Embedded capacitor 105 is typically a two-terminal multiple layer ceramic capacitor (MLCC) that includes a ground terminal G. Positive terminal P also couples to a head switch 110 of a die 102. When head switch 110 is turned on, positive terminal P couples to a substrate power supply net 115 in substrate 100 that supplies power supply voltage VDD2 to die 102. Power supply voltages VDD1 and VDD2 are the same but their respective domains are separated by head switch 110. Die 102 and ground terminal G couple through substrate 100 to a common ground.

There are several problems with such a conventional arrangement. For example, charge from positive terminal P must travel roundtrip to die 102 through head switch 110, from head switch 110 back to substrate power supply net 115, and from power supply net 115 back to die 102. Such a circuitous path increases parasitic inductance and resistance. In addition, because capacitor 105 has just one positive terminal P and one ground terminal G separated by a longitudinal length for capacitor 105, a current loop 125 between these two terminals as shown conceptually in FIG. 1B is relatively large, which also increases parasitic inductance. The resulting parasitic inductance and resistance for embedded capacitor 105 lowers its quality factor Q. Such a reduced quality factor sharply limits the stabilization of substrate power supply net 115, particularly as the frequency of operation is increased for die 102.

Accordingly, there is a need in the art improved embedded capacitor architectures for power decoupling and distribution.

SUMMARY

A substrate is provided that includes a first power distribution network. A die electrically couples to the first power distribution network through a head switch. The substrate includes a cavity containing an embedded multi-terminal capacitor such as a multi-terminal multi-layer ceramic capacitor (MLCC). As used herein, a "multi-terminal" capacitor refers to a capacitor having a plurality of separate positive terminals as well as a plurality of separate ground terminals. This is quite advantageous because the resulting current loops (the current from a positive terminal to a ground terminal) for the embedded multi-terminal capacitor are smaller as compared to a conventional two-terminal embedded capacitor, which lowers inductance. Moreover, adjacent pairs of the current loops induce magnetic fields that at least partially cancel each other, which further lowers inductance.

The multi-terminal capacitor includes a first surface and an opposing second surface. The multiple power and ground terminals are arranged on a pair of sides along a perimeter of the multi-terminal capacitor between the first and second surfaces. A patterned capacitor metal layer includes a plurality of first power rails extending along the first surface of the multi-terminal capacitor. Similarly, the capacitor metal layer also includes a plurality of first ground rails extending along the first surface of the multi-terminal capacitor. The first power rails and first ground rails are arranged to extend across the first surface of the multi-terminal so as to be substantially parallel to each other. The first power rails are arranged into subsets corresponding to the positive terminals of the multi-terminal capacitor. Each subset of the first power rails electrically couples to its corresponding positive terminal. Similarly, the first ground rails are arranged into subsets corresponding to the ground terminals of the embedded capacitor. Each subset of the first round rails electrically couples to its corresponding ground terminal. In one embodiment, the first power rails and the first ground rails may be arranged so as to alternate or interleave with each other.

The substrate may include a substrate metal layer overlaying the capacitor metal layer that is patterned to include second power rails and second ground rails. The second power rails in the substrate metal layer couple to the first power rails in the capacitor metal layer through corresponding vias. Similarly, the second ground rails in the substrate metal layer couple to the first ground rails in the capacitor metal layer through corresponding vias. In one embodiment, the second power rails and second ground rails may be arranged so as to be extend substantially perpendicularly to the first power rails and the first ground rails. In addition, the second power rails and the second ground rails may be interleaved.

The substrate includes a power distribution network that is isolated from the substrate metal layer. A die includes a first plurality of pads coupled through a corresponding first plurality of die interconnects such as micro-bumps or copper pillars to the power distribution network in the substrate. The die includes a head switch coupled to the first plurality of pads. The head switch also couples to an internal power network in the die that in turn couples through a second plurality of pads and a corresponding second plurality of die interconnects to the second power rails. The die includes an internal ground network coupled through a third plurality of pads and through a corresponding third plurality of die interconnects to the second ground rails. This is quite advantageous because the multi-terminal capacitor thus directly powers the internal power network of the die through the first and second plurality of power rails.

The multiple power and ground terminals of the resulting embedded capacitor advantageously reduces parasitic inductance. Moreover, the direct coupling of the multi-terminal capacitor to the internal power and ground network of the capacitor also further reduces parasitic resistance and inductance.

BRIEF DESCRIPTION OF THE DRAWINGS

FIG. 5 is a plan view of the patterned metal layer on a first surface of the multi-terminal capacitor of FIG. 4.

FIG. 6 is a plan view of a patterned metal layer on the substrate overlaying the embedded multi-terminal capacitor of FIG. 5.

FIG. 7A is a cross-sectional view of the initial substrate with its cavity prior to embedding the capacitor.

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1A:
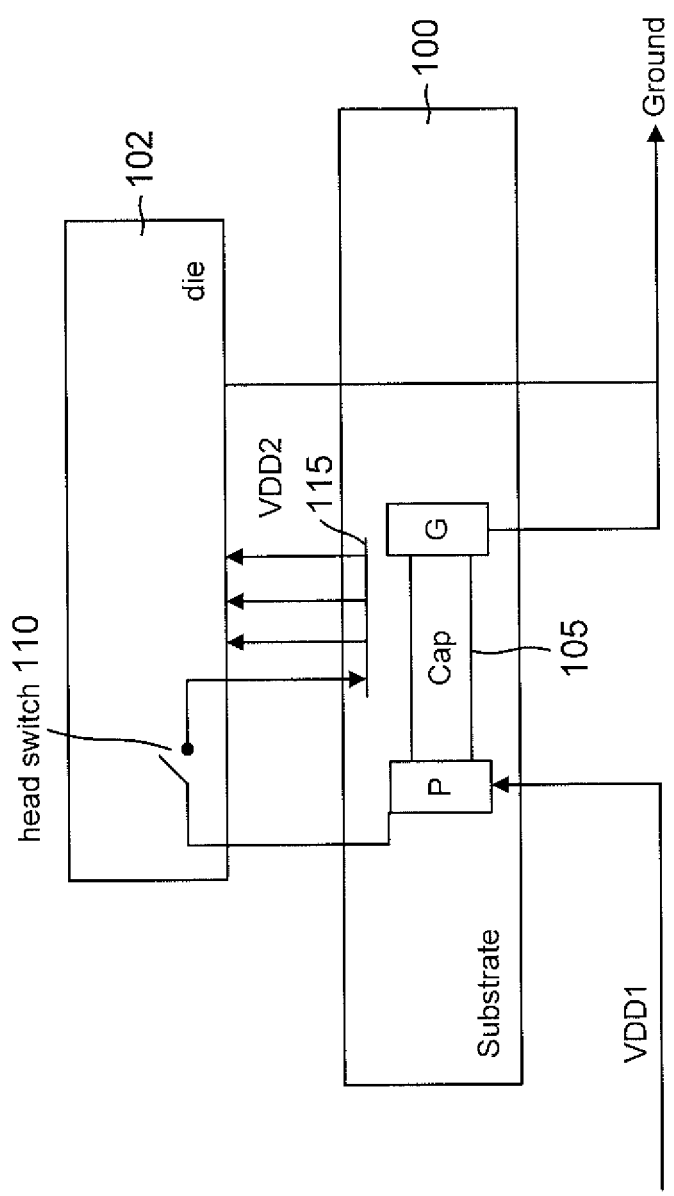
FIG. 1A is a cross-sectional view of a prior-art substrate including a two-terminal embedded passive capacitor coupled to a die.

To provide reduced parasitic inductance and resistance, a substrate includes a cavity containing an embedded multi-terminal capacitor that electrically couples to an internal power network of a die. The die includes a head switch that may couple between an external power network in the substrate and the internal power network. The embedded multi-terminal capacitor electrically couples to the die's internal power network through an electrical path that does not pass through the head switch. Such a direct connection is quite advantageous because the electrical path length between the embedded multi-terminal capacitor and the die's internal power network is minimized. In contrast, note that the positive terminal for the conventional embedded capacitor 105 discussed with regard to FIG. 1A does not directly couple to substrate power net 115 but instead couples to substrate power net 115 through head switch 110. Power or charge for substrate power net 115 must thus first conduct from positive terminal P up to head switch 110 in die 102 and then back down to substrate power net 115. In contrast, the positive terminals for the disclosed embedded multi-terminal capacitor electrically couple directly to the die's internal power network. This direct connection between the positive terminals and the die's internal power network dramatically reduces the parasitic inductance and resistance as compared to conventional architectures such as discussed with regard to conventional embedded capacitor 102. In addition, the resulting current loops between the plurality of positive terminals and a corresponding plurality of ground terminals for the embedded multi-terminal capacitor (current from a positive terminal to a ground terminal) are smaller as compared to a conventional two-terminal embedded capacitor, which further lowers parasitic inductance. An example embodiment will now be discussed.

Example Embodiment

Figure 2:
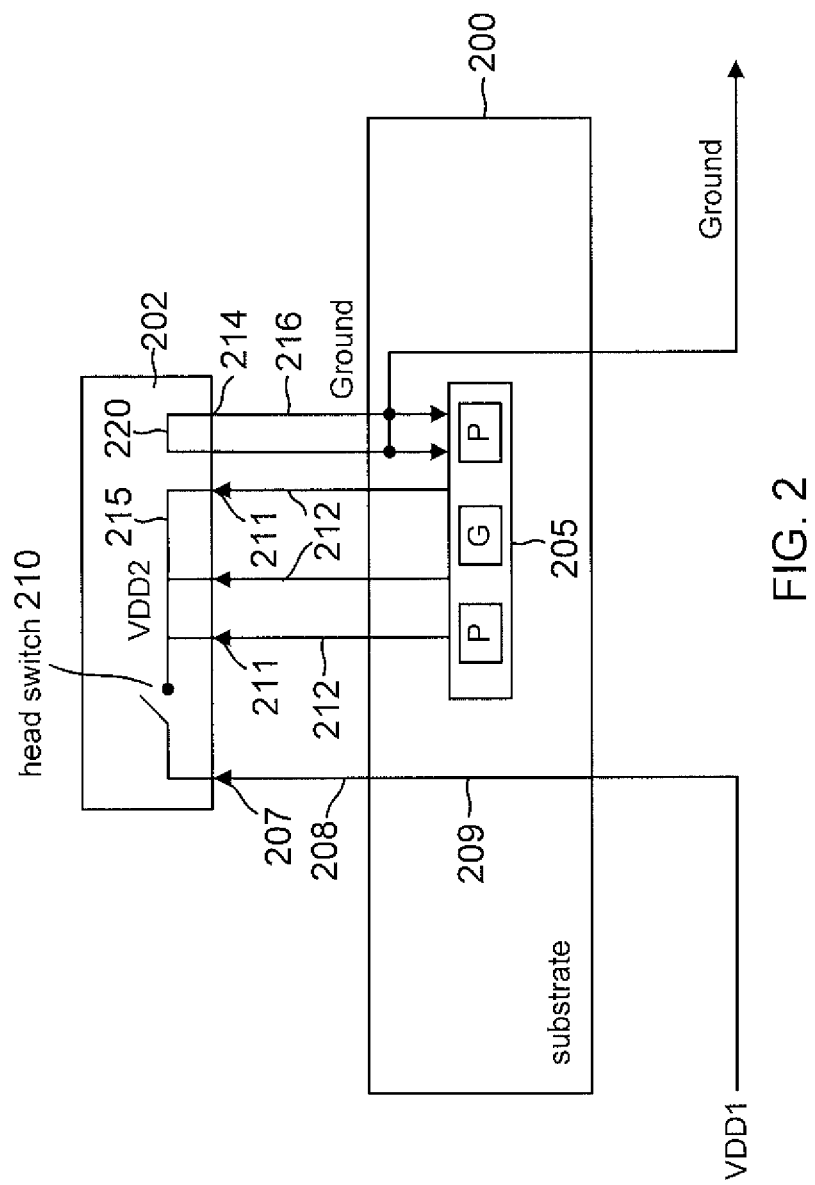
FIG. 2 is a cross-sectional view of a substrate including an embedded multi-terminal capacitor coupled to a die in accordance with an embodiment of the disclosure.

The advantageous features discussed above may be better appreciated with reference to FIG. 2, which shows an example multi-terminal capacitor 205 included within a cavity (not illustrated) within a substrate 200. Substrate 200 includes an external power network 209 (VDD1) that electrically couples to a head switch 210 in a die 202 adjacent substrate 200. Head switch 210 couples to external power network 209 through a first plurality of die pads 207 and corresponding die interconnects 208. For example, die interconnects 208 may comprise micro-bumps or copper pillars. Substrate 200 may comprise a laminated organic substrate, a semiconductor substrate, or a glass substrate.

Die 202 includes an internal power network (VDD2) 215 that electrically couples to head switch 210. Thus, when head switch 210 is closed, internal power network 215 is electrically coupled to external power network 209. Note that alternative embodiments may include a plurality of other head switches arranged in parallel to head switch 210. Each head switch 210 may comprise a MOSFET transistor or other suitable switching circuitry such as a transmission gate. Internal power network 215 also couples through a second plurality of die pads 211 and a corresponding second plurality of die interconnects 212 to a plurality of positive terminals P for multi-terminal capacitor 205. As will be explained further below, the coupling to the positive terminals P occurs through a metal layer (not illustrated in FIG. 2) deposited on multi-terminal capacitor 205. It is this metal layer that electrically couples to positive terminals P. In this fashion, positive terminals P directly couple to the die's internal power network 215.

Die 202 also includes an internal ground network 220 that couples through a third plurality of die pads 214 and a corresponding third plurality of die interconnects 216 to a plurality of ground terminals G for multi-terminal capacitor 205. As discussed with regard to the power terminals P, the electrical coupling occurs through the metal layer discussed further below. The ground terminals G are thus also directly electrically coupled to internal ground network 220 analogously to how the positive terminals P are directly electrically coupled to internal power network 215. The ground terminals G for multi-terminal capacitor 205 electrically couple through substrate 200 to an external ground network. Die interconnects 212 and 216 may comprise micro-bumps, copper pillars or other suitable types of interconnects.

During operation of die 202 with head switch 210 closed, external power network 209 is electrically coupled to the positive terminals P for embedded multi-terminal capacitor 205. Since the ground terminals G are always connected to the external ground, embedded multi-terminal capacitor 205 may thus store charge responsive to the power delivery from external power network 209. Should operation of digital circuitry (not illustrated) within die 202 suddenly demand large amounts of power, embedded multi-terminal capacitor 205 can drive charge to internal network 215 directly through die interconnects 212. In contrast, conventional embedded capacitor 105 of FIG. 1A drives charge through the circuitous route extending from its positive terminal P, up to head switch 110 in die 102, back down to substrate power network 115, and finally back up to die 102. Accordingly, there is substantially less parasitic inductance and parasitic resistance for the power delivery by embedded multi-terminal capacitor 205 as compared to conventional embedded capacitor architectures.

Figure 3:
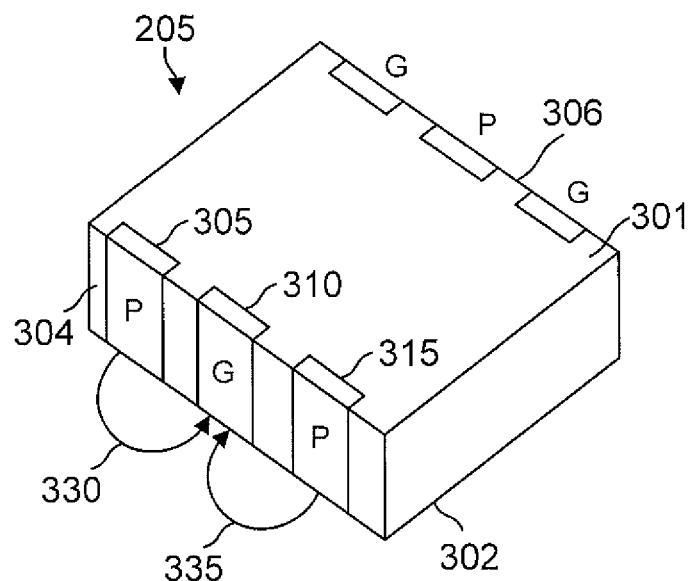
FIG. 3 is a conceptual diagram of the current loops between power and ground terminals for the multi-terminal embedded capacitor of FIG. 2.

Not only is there a shorter path length for power delivery between die 102 and embedded multi-terminal capacitor 205, but the terminals on embedded multi-terminal capacitor 205 also reduce inductance. For example, FIG. 3 shows how the positive terminals (P) and ground terminals (G) for multi-terminal capacitor 205 are arranged on opposing sides 304 and 306 of a perimeter of multi-terminal capacitor 205 that extends between a die-facing surface 301 and an opposing second surface 302. On each side 304 and 306 of multi-terminal capacitor 205, the positive terminals P and ground terminals G alternate with each other. For example, a ground terminal 310 resides between a positive terminal 305 and a positive terminal 315 on side 304 of multi-terminal capacitor 205. Due to this alternation or interleaving of opposing power and ground terminals, the current loop 330 that will be formed between positive terminal 305 and ground terminal 310 flows in a counter-clockwise direction whereas the current loop 335 that flows between positive terminal 315 and ground terminal 310 flows in a clockwise direction. The magnetic fields (not illustrated) that are induced by current loops 330 and 335 are thus opposed to each such that their combined magnetic field is substantially cancelled. Such magnetic field cancellation due to the alternating arrangement of power and ground terminals on embedded capacitor 205 further substantially reduces its parasitic inductance. It will be appreciated that current loops 335 and 330 are illustrated conceptually in FIG. 3 in that they would actually be formed between embedded capacitor 205 and die 202 of FIG. 2 in, for example, die interconnects 212 and 216.

Figure 1B:
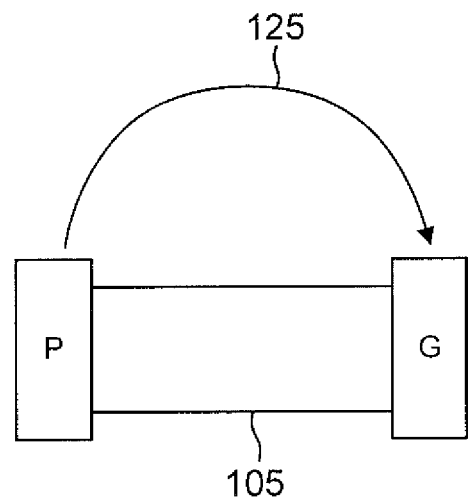
FIG. 1B is a conceptual diagram of the current loop between the two terminals of the embedded passive capacitor of FIG. 1A.

Referring again to FIG. 3, note that positive terminal 305 is immediately adjacent to ground terminal 310, which in turn is immediately adjacent to positive terminal 315. A similar relatively small separation between neighboring positive terminals P and ground terminals G exists on opposing side 306 of capacitor 205. In contrast, note that positive terminal P and ground terminal G for conventional capacitor 105 in FIG. 1B are separated by the longitudinal length for capacitor 105. In this fashion, the current loops for embedded capacitor 205 such as current loops 330 and 335 are much smaller as compared to conventional current loop 125 of FIG. 1B. As known in the inductance arts, the smaller the cross-sectional area for a current loop, the smaller the resulting inductance as compared to driving the same amount of current through a current loop having a larger cross-sectional area. Thus, not only do current loops 330 and 335 partially cancel each other's inductance, what inductance remains is further reduced by the relatively small size for current loops 330 and 335 as compared to conventional current loop 125.

Figure 4:
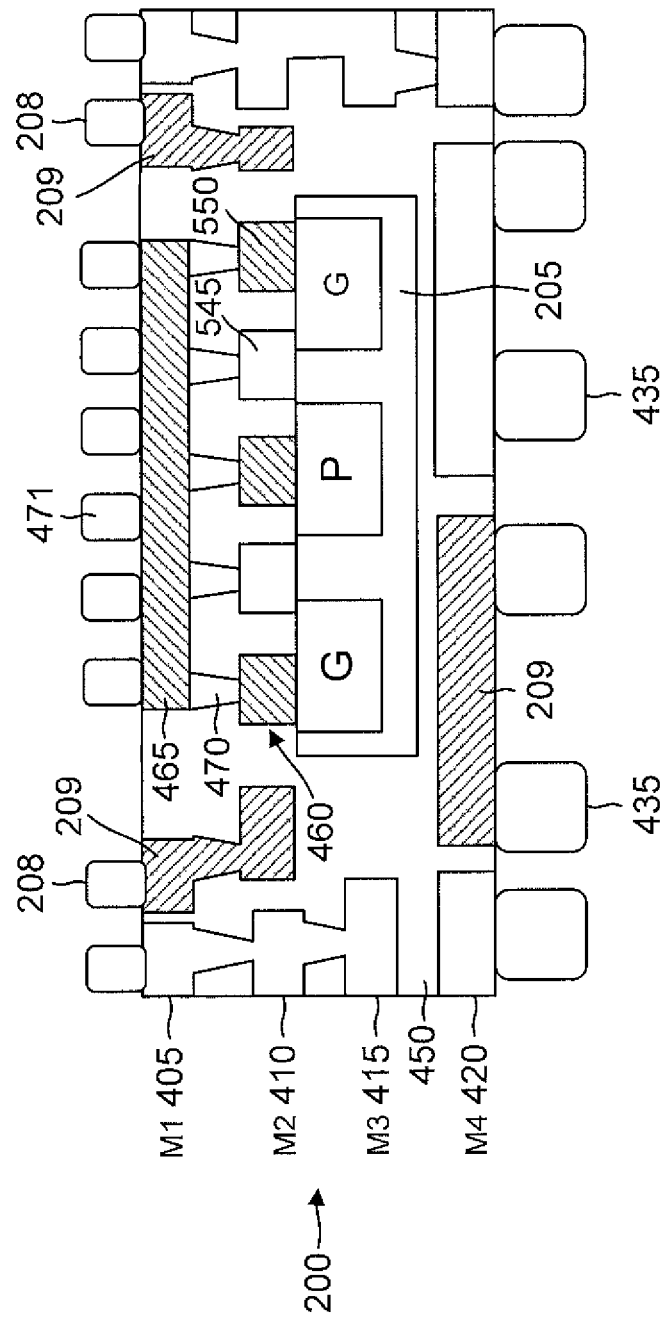
FIG. 4 is a cross-sectional view of a substrate including an embedded multi-terminal capacitor in accordance with an embodiment of the disclosure.

A more detailed cross-sectional view of embedded multi-terminal capacitor 205 in a substrate 200 is shown in FIG. 4. In this embodiment, substrate 200 includes an uppermost M1 metal layer 405, an M2 metal layer 410, an M3 metal layer 415, and finally an M4 metal layer 420. It will be appreciated that additional metal layers may be included in alternative embodiments. The various metal layers are insulated from each other by layers of dielectric material 450. Substrate 200 may also include a core layer (not illustrated). As will be discussed further below, multi-terminal capacitor 205 may be embedded in substrate 200 prior to the formation of M1 metal layer 405 and M4 metal layer 410. Substrate 200 would thus initially include only M2 metal layer 410 and M3 metal layer 415 prior to the embedding of multi-terminal capacitor 205 within a cavity (not illustrated) in substrate 200. Outside of the cavity in which multi-terminal capacitor 205 is embedded, the M1 through M4 metal layers in substrate 200 are configured to form external power network VDD1 209 discussed with regard to FIG. 2 that couples to die interconnects 208. In addition, the M1 through M4 metal layers are configured to carry the various signals (not illustrated) that are routed between die 102 and external devices. The various metal layers in substrate 200 may be deposited and patterned by electroplating and photolithography. Alternatively, electroless techniques may be used. In one embodiment, each metal layer may comprise a plated and patterned copper or nickel layer.

Due to the embedding of multi-terminal capacitor 205 within substrate 200, the M2 metal layer 405 is absent above multi-terminal capacitor 205. However, multi-terminal capacitor 205 includes an equivalent capacitor metal layer 460 that resides at approximately the same depth in substrate 200 as does the M2 405 metal layer. Capacitor metal layer 460 is patterned to include a parallel arrangement of first power rails 550 and first ground rails 545. This parallel arrangement is better shown in the plan view of FIG. 5.

First power rails 550 and first ground rails 545 alternate or interleave with each other on die-facing surface 301 of multi-terminal capacitor 205. There rails extend across die-facing surface between the various power P and ground G terminals. For example, one side of embedded capacitor 205 includes an alternating arrangement of a positive terminal 505, a ground terminal 510, and a positive terminal 515. Conversely, an opposing side of embedded capacitor 205 includes an alternating arrangement of a ground terminal 520, a positive terminal 530, and a ground terminal 535. Each positive terminal couples to one or more first power rails 550. For example, a pair of first power rails 550 couple to positive terminal 505. Similarly, each ground terminal G couples to one or more first ground rail 545. For example, ground terminal 535 couples to a pair of first ground rails 545. In this fashion, first power rails 550 may be deemed to be arranged into subsets corresponding to the power terminals. For example, power terminal 505 electrically couples to a subset of two first power rails 550. Similarly, first ground rails may be deemed to be arranged into subsets electrically coupled to corresponding ground terminals. First power rails 550 extend from their positive terminals towards the opposing ground terminals on the other side of multi-terminal capacitor 205. In an analogous fashion, first ground rails 545 extend from their ground terminals towards the opposing positive terminal on the other side of multi-terminal capacitor 205.

Unlike capacitor metal layer 460, which is deposited on multi-terminal capacitor 205 prior to its placement in substrate 200, M1 metal layer 405 is deposited on substrate 200 after the placement of multi-terminal capacitor 205. A capacitor metal layer portion 465 of M1 metal layer 405 overlays capacitor metal layer 460 and couples to capacitor metal layer 460 through vias 470. A plan view of capacitor metal layer portion 465 is shown in FIG. 6. In addition, a portion of external power network 209 formed from M1 metal layer 405 is also shown in FIG. 6. Analogous to capacitor metal layer 460, capacitor metal layer portion 465 may also be arranged into alternating second power rails 605 and second ground rails 600. To minimize inductive coupling to first power rails 550 and first ground rails 545, second power rails 605 and second ground rails 600 may be arranged so as to extend in a direction that is substantially orthogonal to the direction in which first power rails 550 and first ground rails 545 extend across surface 301 of multi-terminal 205. Note that capacitor metal layer portion 465 need not be entirely arranged into second power rails 605 and second ground rails 600. For example, capacitor metal layer portion 465 may include isolated ground terminals 620. Similarly, capacitor metal layer portion 465 may include isolated positive terminals (not illustrated).

Second ground rails 600 and any isolated ground terminals 620 in capacitor metal layer portion 465 couple through corresponding die interconnects 471 shown in FIG. 4 to corresponding ground pads on the associated die (not illustrated in FIG. 4). Similarly, second power rails 605 and any isolated positive terminals in capacitor metal layer portion 465 couple through corresponding die interconnects 471 to corresponding pads on the associated die. Second ground rails 600 and any isolated ground terminals 620 in capacitor metal layer portion 465 also couple through corresponding vias 470 to first ground rails 545. First ground rails 545 in turn couple to their corresponding ground terminals G on multi-terminal capacitor 205. The ground connection between the associated die and ground terminals G thus extends in the advantageously short and direct path formed by first ground rails 545 in capacitor metal layer 460, corresponding vias 470, second ground rails 600 (and any isolated ground terminals 620) in capacitor metal layer portion 465, and corresponding die interconnects 471. In an analogous fashion, the power connection between the associated die and positive terminals P on multi-terminal capacitor 205 extends in the advantageously short and direct path formed by first power rails 550 in capacitor metal layer 460, corresponding vias 470, second power rails 605 (and any isolated positive terminals) in capacitor metal layer portion 465, and corresponding die interconnects 471.

In one embodiment, die interconnects 212 may be deemed to comprise a means for electrically coupling the die's internal power network 215 to the capacitor power network (first power rails 550) and for electrically coupling the internal ground network 220 to the capacitor ground network (first ground rails 545). This means for electrically coupling may further include metal layer 465 as well as vias 470. An example method of manufacture will now be discussed.

Example Method of Manufacture

A starting substrate 200 as shown in FIG. 7A includes only the M2 metal layer 410 and M3 metal layer 415 discussed with regard to FIG. 4. A cavity 480 may then be machined or laser drilled into substrate 200. The M2 metal layer 410 and M3 metal layer 415 are of course absent in the substrate area that will be machined out or otherwise removed to form cavity 480. In substrate 200, the M2 metal layer 410 and M3 metal layer 415 are configured as desired to accommodate the eventual formation of the external power net 209 discussed with regard to FIGS. 2 and 4 as well as to accommodate the various signals routed between the associated die and external devices.

Multi-terminal capacitor 205 and its first ground rails 545 and first power rails 550 may then be secured into cavity 480 with an appropriate adhesive such as an epoxy(not illustrated). The remainder of cavity 480 may then be filled with a dielectric material 710 such as a laminated dielectric material. Alternatively dielectric material 710 may be deposited such as through a spun-on layer of polyimide or other types of dielectric polymers such as Ajinomoto build-up film, or benzocyclobutene-based polymer. As shown in the cross-sectional view of FIG. 7B, multi-terminal capacitor 205 is secured within substrate 200 such that first power rails 550 and first ground rails 545 are substantially at the same level in substrate 200 as the M2 metal layer 410. A surface 701 of substrate 200 as well as an opposing surface 706 may then be planarized such as through a grinding step. Referring back to FIG. 4, an additional layer of dielectric material 450 and M1 metal layer 405 including its capacitor metal layer portion 465 as well as vias 470 may then be deposited on surface 701 (FIG. 7B) of substrate 200. The additional layer of dielectric material may first be patterned and plated so as to form vias 470. M1 metal layer 405 would then be deposited so as to couple to vias 470. In that regard, a first set of vias 470 electrically couple between first power rails 550 and second power rails 605. A second set of vias electrically couple between first ground rails 545 and second ground rails 600.

Similarly, additional dielectric material 450 and M4 metal layer 420 may be deposited on surface 702 (FIG. 7B) of substrate 200. The formation of metal layers M1 through M4 may be performed using electroplating (or electroless deposition) and corresponding patterning using photolithography. Attachment of solder balls 435 and die interconnects 208 and 471 complete the manufacture of substrate 200 including embedded capacitor 205.

Figure 7B:
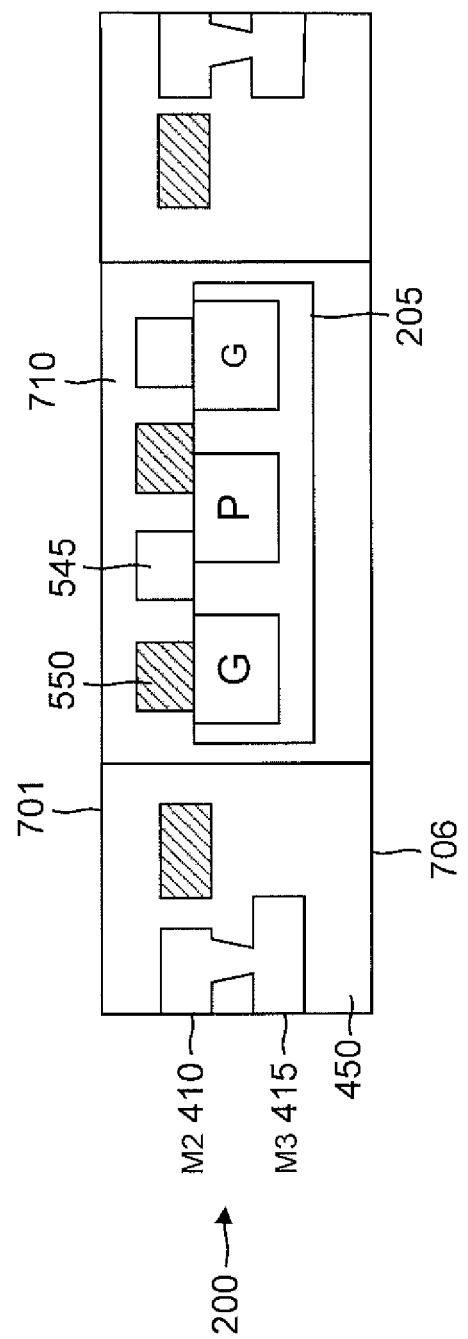
FIG. 7B is a cross-sectional view of the substrate of FIG. 7A after embedding the capacitor and prior to formation of the M1 and M4 metal layers.
Figure 7C:
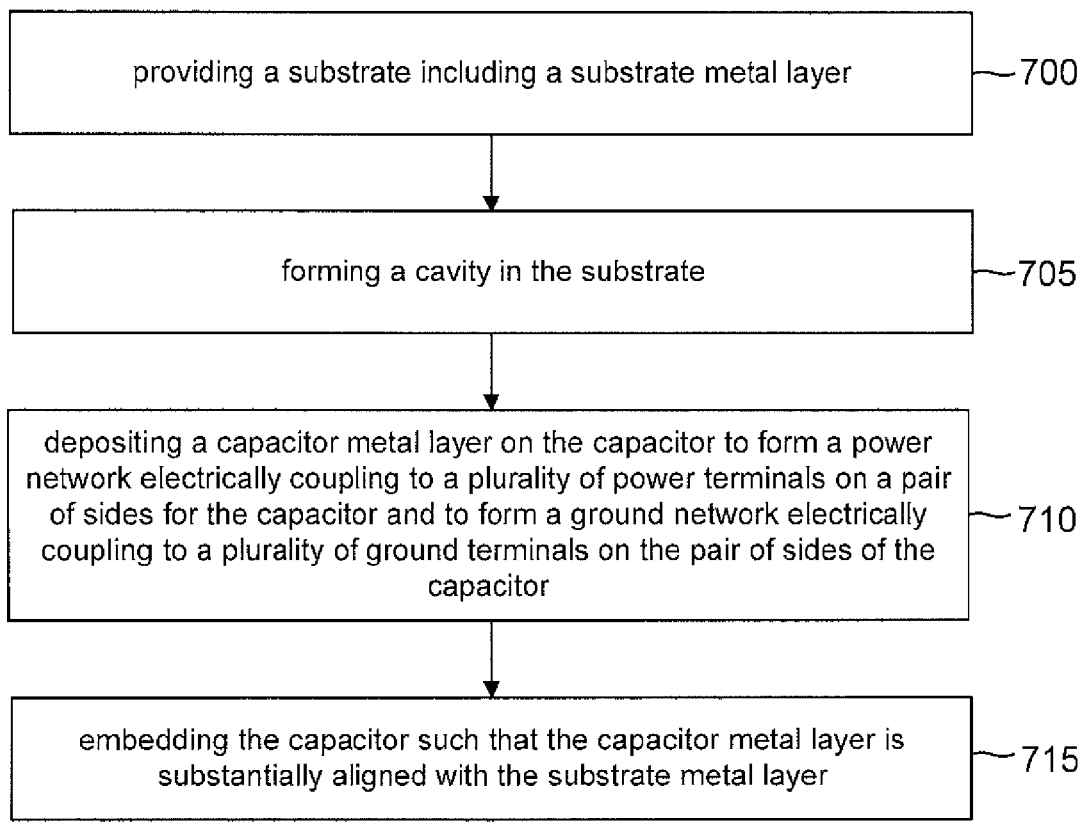
FIG. 7C is a flowchart summarizing a method of manufacture for an embedded multi-terminal capacitor in accordance with an embodiment of the disclosure.

The manufacture of substrate 200 with embedded substrate 205 may be summarized in the flowchart of FIG. 7C. A step 700 comprises providing a substrate including a capacitor metal layer. Substrate 200 including M2 metal layer 410 as discussed with regard to FIG. 7A is an example of such a step.

The method further includes a step 705 of forming a cavity in the substrate. The formation of cavity 480 of FIG. 7A is an example of such a manufacturing step. The method further includes a step 710 of depositing a capacitor metal layer on a capacitor to form a power network electrically coupling to a plurality of power terminals on a pair of sides of the capacitor and to form a ground network electrically coupling to a plurality of ground terminals on the pair of sides of the capacitor. First power rails 550 in, for example, FIG. 7B are an example of the power network. Similarly, first ground rails in FIG. 7B are an example of the ground network.

Finally, the method includes a step 715 of embedding the capacitor in the cavity such that the capacitor metal layer is substantially aligned with the substrate's metal layer. FIG. 7B provides an example of such a substantial alignment of first power rails 550 and first ground rails 545 with the substrate's M2 metal layer 410. This alignment is quite advantageous because the subsequent deposition of the substrate's M1 metal layer 405 (FIG. 4) may be performed in a conventional fashion. In other words, it is transparent to the deposition of M1 metal layer 405 as to what portions are over M2 metal layer 410 and what portions are over multi-terminal capacitor 205 since multi-terminal capacitor 205 couples to M1 metal layer 405 through the capacitor metal layer 460 and corresponding vias 470. Similar vias couple between M1 metal layer 405 and M2 metal layer 410. An example method of use for embedded capacitor 205 will now be discussed.

Example Method of Use

Figure 7D:
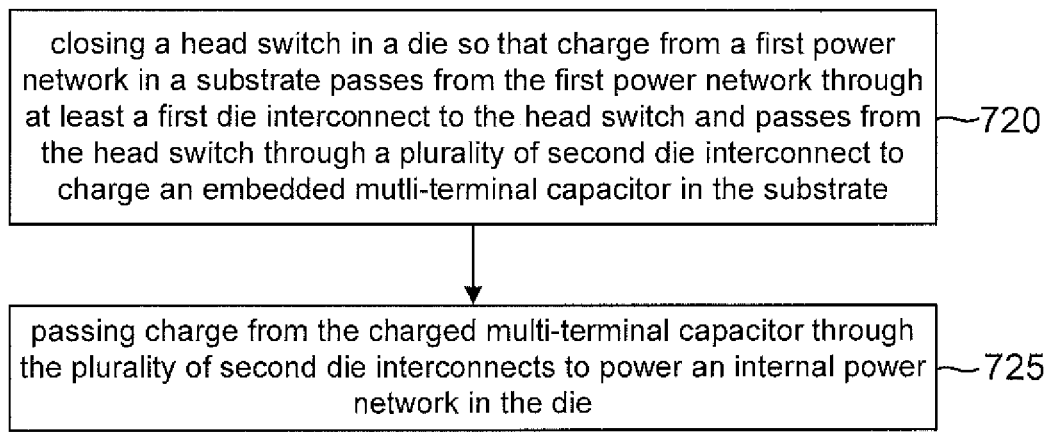
FIG. 7D is a flowchart for a method of use for an embedded multi-terminal capacitor in accordance with an embodiment of the disclosure.

FIG. 7D is a flowchart for an example method of use. The method includes a step 720 of closing a head switch in a die so that charge from a first power network in a substrate passes from the first power network through at least a first die interconnect to the head switch and passes from the head switch through a plurality of second die interconnects to charge an embedded multi-terminal capacitor in the substrate. Referring again to FIG. 2, external power network 209 is an example of the first power network of step 720. Similarly, die interconnect 209 is an example of the first die interconnect of step 720. Moreover, die interconnects 212 are an example of the plurality of second die interconnects of step 720. For example, charge flows from external network 209 through die interconnect 208 and a die pad 207 into head switch 210. From head switch 210, the charge flows through die pads 211 and die interconnects 212 to charge multi-terminal capacitor 205.

The method of FIG. 7D also includes a step 725 of passing charge from the charged multi-terminal capacitor through the plurality of second die interconnects to power an internal power network in the die. Die interconnects 212 in FIG. 2 are an example of such second die interconnects that pass charge from charged multi-terminal capacitor 205 to power internal power network 215 of die 202. Some example electronic systems that may advantageously incorporate a semiconductor package including the substrate and embedded multi-terminal capacitor disclosed herein will now be discussed.

Example Electronic Systems

Figure 8:
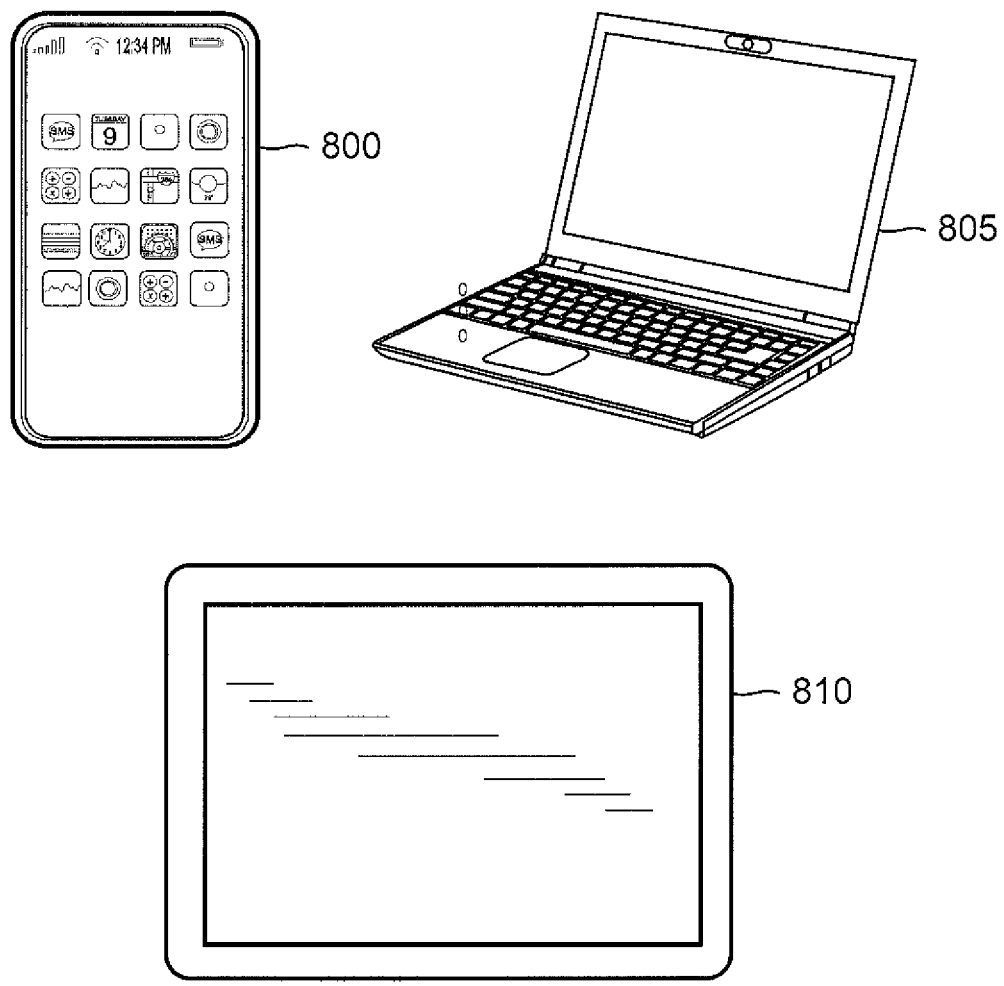
FIG. 8 illustrates some example electronic systems incorporating a substrate including an embedded multi-terminal capacitor in accordance with an embodiment of the disclosure.

Integrated circuit packages including an embedded multi-terminal capacitor as disclosed herein may be incorporated into a wide variety of electronic systems. For example, as shown in FIG. 8, a cell phone 800, a laptop 805, and a tablet PC 810 may all include an integrated circuit package incorporating embedded multi-terminal capacitor constructed in accordance with the disclosure. Other exemplary electronic systems such as a music player, a video player, a communication device, and a personal computer may also be configured with integrated circuit packages constructed in accordance with the disclosure.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A device, comprising:
    a substrate comprising a cavity, a first metal layer, and an external power network;
    a die comprising an internal power network and an internal ground network, wherein the internal power network is coupled to the external power network;
    a multi-terminal capacitor embedded within the cavity, wherein the multi-terminal capacitor is configured to electrically couple to the internal power network of a die and the internal ground power network of the die, the multi-terminal capacitor including:
        a first side;
        a second side substantially opposite to the first side;
        a plurality of positive terminals comprising a first positive terminal and a second positive terminal; and
        a plurality of ground terminals comprising a first ground terminal and a second ground terminal;
        wherein the first positive terminal and the first ground terminal are on the first side of the multi-terminal capacitor, and
        wherein the second positive terminal and the second ground terminal are on the second side of the multi-terminal capacitor;
    a first capacitor metal layer on a surface of the multi-terminal capacitor, wherein the first capacitor metal layer is substantially co-planar with the first metal layer of the substrate, the first capacitor metal layer configured to form a capacitor power network electrically coupled to the first positive terminal, wherein the capacitor power network is configured to be electrically coupled to the internal power network of the die; and
    a second capacitor metal layer on a surface of the multi-terminal capacitor, wherein the second capacitor metal layer is substantially co-planar with the first metal layer of the substrate, the second capacitor metal layer configured to form a capacitor ground network electrically coupled to the first ground terminal, wherein the capacitor ground network is configured to be electrically coupled to the internal ground network of the die.

2. The device of claim 1, wherein the multi-terminal capacitor includes a die-facing surface, and an opposing surface, and wherein the plurality of positive terminals and the plurality of ground terminals are distributed on side walls of the multi-terminal capacitor extending between the die-facing surface and the opposing surface.

3. The device of claim 1, wherein the substrate includes a plurality of metal layers, and wherein the capacitor metal layer is substantially aligned with an intermediate metal layer of the plurality of metal layers of the substrate.

4. The device of claim 1, wherein the external power network bypasses the multi-terminal capacitor when the external power network traverses between the substrate and the die.

5. The device of claim 1, wherein the plurality of positive terminals includes a third positive terminal on the first side of the multi-terminal capacitor, and the plurality of ground terminals includes a third ground terminal on the second side of the multi-terminal capacitor.

6. The device of claim 5, wherein the first ground terminal is on the first side such that the first ground terminal is between the first positive terminal and the third positive terminal, and wherein the second positive terminal is on the second side such that the second positive terminal is between the second ground terminal and the third ground terminal.

7. The device of claim 1, wherein the first capacitor metal layer is arranged into a plurality of first power rails and the second capacitor metal layer is arranged into a plurality of first ground rails.

8. The device of claim 7 wherein the internal power network is electrically coupled to the first power rails through a plurality of first die interconnects.

9. The device of claim 8, wherein the substrate includes a plurality of metal layers configured to form the external power network, and wherein the die includes a head switch electrically coupled to the external power network through at least a second die interconnect, the head switch being further electrically coupled to a plurality of second die interconnects.

10. The device of claim 7, wherein the substrate includes a fourth metal layer overlaying the first capacitor metal layer and the second capacitor metal layer, and wherein the fourth metal layer is configured to includes a plurality of second power rails electrically coupled to the first power rails, and wherein the fourth metal layer is configured to include a plurality of second ground rails electrically coupled to the first ground rails.

11. The device of claim 10, wherein the first power rails and the first ground rails are interleaved, and wherein the second power rails and the second ground rails are interleaved.

12. The device of claim 11, wherein the first power rails and the first ground rails are arranged to extend in a first direction, and wherein the second power rails and the second ground rails are arranged to extend in a second direction that is orthogonal to the first direction.

13. The device of claim 1, wherein the multi-terminal capacitor is a multi-layer ceramic capacitor.

14. A method, comprising:
providing a substrate including a substrate metal layer and an external power network;
forming a cavity in the substrate;
embedding a capacitor in the cavity such that a capacitor metal layer is substantially aligned with the substrate metal layer, wherein embedding the capacitor comprises providing a multi-terminal capacitor that includes (i) a plurality of power terminals comprising a first power terminal and a second power terminal, and (ii) a plurality of ground terminals comprising a first ground terminal and a second ground terminal, wherein the first power terminal and the first ground terminal are on a first side of the multi-terminal capacitor, and wherein the second power terminal and the second ground terminal are on a second side of the multi-terminal capacitor, the second side being substantially opposite to the first side;
depositing the capacitor metal layer on a first surface of the multi-terminal capacitor to form a capacitor power network electrically coupling to the first power terminal of the multi-terminal capacitor, and to form a capacitor ground network electrically coupling to the first ground terminal of the multi-terminal capacitor, and wherein the capacitor power network is formed such that the capacitor power network is configured to electrically couple to an internal power network of a die; and
coupling the die to the substrate such that the internal power network of the die is electrically coupled to the capacitor power network and the external power network of the substrate, wherein the external power network bypasses the capacitor when traversing between the substrate and the die.

15. The method of claim 14, wherein depositing the capacitor metal layer comprises depositing a plurality of first power rails to form the capacitor power network and depositing a plurality of first ground rails to form the capacitor ground network.

16. The method of claim 15, further comprising:
forming a dielectric layer on the substrate after embedding the capacitor in the cavity;
forming a first plurality of vias through the dielectric layer, the first plurality of vias electrically coupling to the first power rails; and
forming a second plurality of vias through the dielectric layer, the second plurality of vias electrically coupling to the first ground rails.

17. The method of claim 16, further comprising:
depositing an additional metal layer on the dielectric layer to form a plurality of second power rails and a plurality of second ground rails, the plurality of second power rails electrically coupling to the first plurality of vias and the plurality of second ground rails electrically coupling to the second plurality of vias.

18. The method of claim 14, wherein the die's internal power network electrically couples through a plurality of first die interconnects to the power network in the capacitor metal layer.

19. The method of claim 18, wherein coupling the die electrically couples an internal ground network in the die through a plurality of second die interconnects to the ground network in the capacitor metal layer.

20. The method of claim 14, wherein embedding the capacitor in the cavity further comprises filling a remainder of the cavity with dielectric material.

21. The method of claim 14, wherein depositing the capacitor metal layer comprises depositing a copper capacitor metal layer.

22. An integrated circuit package, comprising:
a substrate including a cavity;
a multi-terminal capacitor embedded in the cavity, wherein the multi-terminal capacitor comprises:
a first side;
a second side substantially opposite to the first side;
a plurality of positive terminals comprising a first positive terminal and a second positive terminal; and
a plurality of ground terminals comprising a first ground terminal and a second ground terminal;
wherein the first positive terminal and the first ground terminal are on the first side of the multi-terminal capacitor, and
wherein the second positive terminal and the second ground terminal are on the second side of the multi-terminal capacitor;
a capacitor metal layer over a first surface of the multi-terminal capacitor, the capacitor metal layer including a capacitor power network electrically coupled to the plurality of positive terminals for the multi-terminal capacitor, and including a capacitor ground network electrically coupled to the plurality of ground terminals for the multi-terminal capacitor;
a die comprising an internal power network and an internal ground network; and
means for electrically coupling the internal power network to the capacitor power network and for electrically coupling the internal ground network to the capacitor ground network, such that the internal power network and the internal ground network are configured to electrically couple to the multi-terminal capacitor.

23. The integrated circuit package of claim 22, wherein the substrate further includes an external power network that is configured to be electrically coupled to the internal power network of the die.

24. The integrated circuit package of claim 23, wherein the die includes a head switch electrically coupled between the external power network and the internal power network.

25. The integrated circuit package of claim 22, wherein the substrate comprises an organic substrate.

26. The integrated circuit package of claim 22, wherein the substrate comprises a semiconductor substrate.

27. The integrated circuit package of claim 22, wherein the capacitor metal layer comprises a patterned copper metal layer.

28. The integrated circuit package of claim 22, wherein the integrated circuit package is incorporated into at least one of a cellphone, a laptop, a tablet, a music player, a communication device, a computer, and a video player.

29. The integrated circuit package of claim 22, wherein the external power network bypasses the multi-terminal capacitor when the external power network traverses between the substrate and the die.

* * * * *